(12) United States Patent
Glance (10) Patent No.: US 6,370,170 B1
(45) Date of Patent: Apr. 9, 2002

(54) LASER FREQUENCY STABILIZATION APPARATUS

(75) Inventor: Bernard Glance, Colts Neck, NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/336,071

(22) Filed: Jun. 18, 1999

Related U.S. Application Data (60) Provisional application No. 60/114,250, filed on Dec. 30, 1998.

(51) Int. Cl.$^7$ .................................................. H01S 3/13
(52) U.S. Cl. ........................ 372/32; 372/28; 372/38.01
(58) Field of Search ......................... 372/32, 28, 38.01

(56) References Cited

U.S. PATENT DOCUMENTS

| | | | |
|---|---|---|---|
| 3,676,799 A | | 7/1972 | Danielmeyer |
| 3,866,139 A | | 2/1975 | Currie |
| 3,982,101 A | * | 9/1976 | Kalb et al. ................... 235/152 |
| 4,229,831 A | * | 10/1980 | Lacher ......................... 455/619 |
| 4,255,791 A | * | 3/1981 | Martin ......................... 634/514 |
| 4,480,232 A | * | 10/1984 | Baker et al. ................ 331/1 A |
| 4,730,323 A | | 3/1988 | Seaton |
| 4,823,348 A | | 4/1989 | Hercher |
| 4,856,010 A | | 8/1989 | Wissman et al. |
| 4,861,136 A | * | 8/1989 | Stone et al. ................ 350/96.3 |
| 4,914,666 A | * | 4/1990 | Glance ......................... 372/20 |
| 4,953,169 A | | 8/1990 | Schlemmer et al. |
| 5,068,864 A | | 11/1991 | Javan |
| 5,153,888 A | | 10/1992 | Imamura et al. |
| 5,216,477 A | | 6/1993 | Korb |
| 5,615,224 A | * | 3/1997 | Cohen .......................... 372/36 |
| 5,828,689 A | | 10/1998 | Epworth |
| 6,115,403 A | * | 9/2000 | Brenner et al. ............. 372/102 |
| 6,229,631 B1 | * | 5/2001 | Sato et al. ................... 359/110 |

OTHER PUBLICATIONS

B. Villenueve et al. High–stability wavelength–controlled DFB laser sources for dense WDM applications. OFC '98 Technical Digest. Paper No. FB5. pp. 381–382 (No Month).

\* cited by examiner

*Primary Examiner*—James W. Davie
*Assistant Examiner*—Davienne Monbleau
(74) *Attorney, Agent, or Firm*—Kenyon & Kenyon

(57) ABSTRACT

An apparatus and a method for laser frequency stabilization include a laser, a modulator, a derivative module, a Fabry-Perot etalon, a photodetector, a balanced mixer, a signal processing module, and a feedback control module. The laser has an output and lases at a single frequency. The laser has a desired frequency and provides an optical signal including a substantial frequency chirp signal. The modulator is coupled to the laser and provides a modulation signal for modulating the laser. The derivative module is coupled to the modulator and provides a derivative signal which is a time derivative of the modulation signal. The Fabry-Perot etalon is coupled to the output of the laser and has a frequency response including a plurality of resonances. One of the plurality of resonances is centered on the desired frequency. The etalon filters the optical signal according to the frequency response. The photodetector is coupled to the etalon and receives the filtered optical signal and provides a photocurrent in response to the filtered optical signal. The balanced mixer is coupled to the photodetector and to the derivative module. The balanced mixer provides a mixed signal by mixing the photocurrent with the derivative signal. The signal processing module is coupled to the balanced mixer and provides an error signal which is a time average of the mixed signal. The feedback control module is couple to the signal processing module and the laser. The feedback control module uses the error signal in order to adjust the single frequency of the laser.

16 Claims, 6 Drawing Sheets

LASER FREQUENCY STABILIZATION APPARATUS

PRIORITY CLAIM

I hereby claim the benefit under 35 U.S.C. § 119(e) of U.S. Provisional Application No. 60/114,250 filed Dec. 30, 1998, entitled "A Method and Apparatus for Laser Frequency Stabilization."

FIELD OF THE INVENTION

The present invention relates generally to the field of optical communications, and more specifically to the field of lasers.

BACKGROUND INFORMATION

The frequency stabilization of laser devices is highly valued especially in optical communication systems using dense wavelength division multiplexing (DWDM). Such systems presently envision using eighty or more wavelengths with approximately 50 GHz channel spacings which require laser frequency stabilization within, at the most, a few gigahertz in order to avoid, for example, channel interference. Frequency stabilization has typically been achieved using a variety of different techniques.

One conventional technique uses a laser, a piezoelectric device, a modulator, a Fabry-Perot etalon (FP), a photodiode and a balanced mixer. The output of the laser is fed into the FP. The modulator modulates the piezoelectric device which changes the effective cavity length of the FP. In the art, this is referred to as dithering the laser frequency. The output of the FP is received by the photodiode which creates an electrical signal. The electrical signal and the signal from the modulator are combined in the balanced mixer. The output of the balanced mixer creates an error signal from which feedback circuitry may detect changes in the frequency of the laser and make adjustments to the laser frequency to, in effect, stabilize the laser frequency.

This technique has the disadvantage of using the piezoelectric device to electromechanically modulate the FP. It is desirable in a number of circumstances to avoid such active dithering.

Another conventional technique employs a laser, a splitter, an offset control, an FP, a first photodetector, a second photodetector and a differential amplifier. The output from the laser is split such that a portion of the light enters the FP and the remaining portion enters the offset control. The output of the FP enters the first photodetector which creates a first photocurrent. The output of the offset control enters the second photodetector which creates a second photocurrent. The two photocurrents provide input signals for the differential amplifier. The output of the differential amplifier creates an error signal from which feedback circuitry may detect changes in the frequency of the laser and make adjustments to the laser frequency to stabilize the laser frequency. The offset control is used during an initialization process to set a zero output for the differential amplifier when the desired frequency is obtained.

This technique suffers from its dependence upon the differential amplifier and the offset control. If the offset control drifts, then the zero output point drifts and the error signal will not be reliable. Furthermore, the second technique depends heavily upon the stability of the differential amplifier which must be highly reliable and must not change with time.

What is needed is a laser frequency stabilization technique that is passive and highly reliable.

SUMMARY OF THE INVENTION

The present invention provides for a laser frequency stabilization system having a laser lasing at a single frequency. The laser has a desired frequency and provides an optical signal including a substantial frequency chirp signal. An optical filter is coupled to the laser and has a frequency response with a resonant peak centered on the desired frequency of the laser. The optical filter filters the optical signal according to the frequency response. A photodetector is coupled to the optical filter and provides a photocurrent in response to the filtered optical signal. A modulator is coupled to the laser and provides a modulation signal which modulates the optical signal of the laser. A derivative module is coupled to the modulator and provides a derivative signal which is a time derivative of the modulation signal. A balanced mixer is coupled to the derivative module and to the photodetector. The balanced mixer provides a mixed signal including a mixing of the photocurrent and the derivative signal.

The present invention also provides for an apparatus for laser frequency stabilization including a laser, a modulator, a derivative module, a Fabry-Perot etalon, a photodetector, a balanced mixer, a signal processing module, and a feedback control module. The laser has an output and lases at a single frequency. The laser has a desired frequency and provides an optical signal at the output of the laser. The optical signal includes a substantial frequency chirp signal. The modulator is coupled to the laser and provides a modulation signal for modulating the laser. The derivative module is coupled to the modulator and provides a derivative signal which is a time derivative of the modulation signal. The Fabry-Perot etalon is coupled to the output of the laser and has a frequency response including a plurality of resonances. One of the plurality of resonances is centered on the desired frequency. The etalon filters the optical signal according to the frequency response. The photodetector is coupled to the etalon and receives the filtered optical signal and provides a photocurrent in response to the filtered optical signal. The balanced mixer is coupled to the photodetector and to the derivative module. The balanced mixer provides a mixed signal by mixing the photocurrent with the derivative signal. The signal processing module is coupled to the balanced mixer and provides an error signal which is a time average of the mixed signal. The feedback control module is coupled to the signal processing module and the laser. The feedback control module uses the error signal in order to adjust the single frequency of the laser.

The present invention also provides for a laser frequency stabilization system including a laser with a desired laser frequency. The laser frequency stabilization system includes an optical signal, emitted from the laser, including a substantial frequency chirp signal; means for filtering the frequency chirp signal according to frequency; and means for providing an error signal from the filtered frequency chirp signal.

The present invention provides for a method for stabilizing laser frequency. The method includes the steps of providing a modulation signal, modulating an optical signal from a laser by the modulation signal, redirecting part of the optical signal including a frequency chirp signal to an optical filter, centering a resonant response of the optical filter around a desired frequency of the laser, filtering the optical signal according to the resonant response of the optical filter, creating a photocurrent from the filtered optical signal, mixing the photocurrent with a time derivative of the modulation signal and time averaging the mixed signal.

The present invention also provides for a process for creating an error signal for a laser frequency stabilization system. The process includes the steps of creating a substantial frequency chirp signal, creating a sloped frequency response around a lasing frequency, filtering the frequency chirp signal according to the sloped frequency response and deriving the error signal from the filtered frequency chirp signal.

The present invention also provides for a method for creating an error signal for a laser frequency stabilization system. The method includes the step of using a frequency chirp signal from a modulated laser to create the error signal.

DETAILED DESCRIPTION

Figure 1:
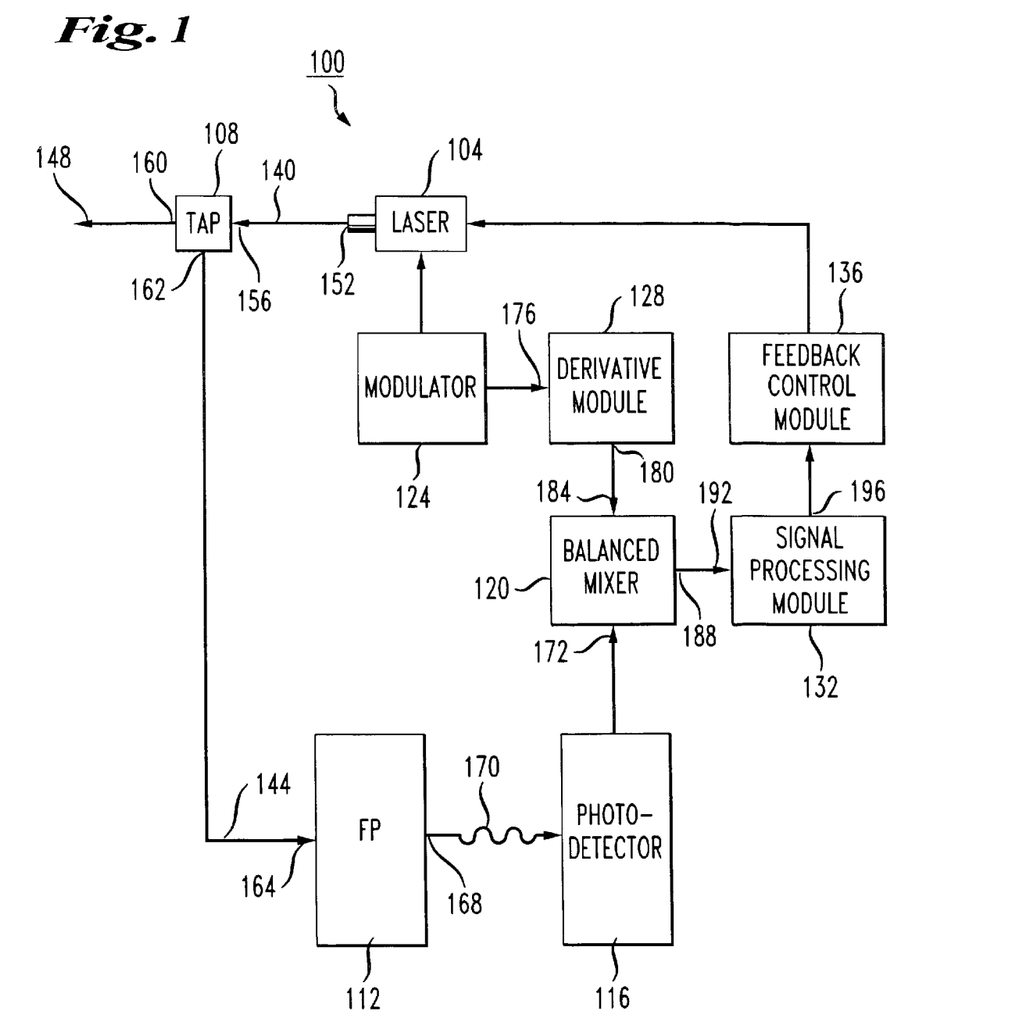
FIG. 1 illustrates a block diagram of an embodiment of a frequency stabilization system according to the present invention.

FIG. 1 illustrates a block diagram of a frequency stabilization system 100 according to a preferred embodiment of the present invention. Referring to FIG. 1, the frequency stabilization system 100 comprises a laser 104, an optical tap 108, a Fabry-Perot etalon (FP) 112, a photodetector 116, a balanced mixer 120, a modulator 124, a derivative module 128, a signal processing module 132, a feedback control module 136, and optical fibers 140, 144 and 148.

The laser 104 has an output 152 which is coupled to an input 156 of the optical tap 108 through the optical fiber 140. In a preferred embodiment, the laser 104 is designed to lase at a desired frequency. The laser 104 is preferably a semiconductor laser such as, for example, an InGaAsP laser or a GaAs laser. However, the present invention also contemplates lasers comprising other media such as, for example, gas. The optical tap 108 may comprise a partially reflecting mirror, an optical splitter, a directional coupler and/or similar devices. The optical fiber 148 which extends externally from the frequency stabilization system 100 is coupled to a first output 160 of the optical tap 108.

An input 164 of the FP 112 is coupled to a second output 162 of the optical tap 108. The FP 112 comprises an optical cavity characterized, in a preferred embodiment, by a frequency response having a plurality of resonances. The FP 112 is designed such that one of the resonances in the frequency response is centered on the desired laser frequency.

The photodetector 116 is coupled to an output 168 of the FP 112. The photodetector 116 comprises a photodiode and a resistor. The photodetector 116 is coupled to a first input 172 of the balanced mixer 120. The modulator 124 is coupled to the laser 104 and also to an input 176 of the derivative module 128. The derivative module 128 comprises a circuit adapted for computing the time derivative of a signal provided at the input 176 of the module 128. The circuit may comprise a capacitor and a resistor, and may further comprise an operation amplifier. Alternatively, the circuit may be a digital circuit. An output 180 of the derivative module 128 is coupled to a second input 184 of the balanced mixer 120.

An output 188 of the balanced mixer 120 is coupled to an input 192 of the signal processing module 132. The signal processing module 132 comprises circuitry adapted to take the time average of a signal provided at the input 192 of the module 132. The circuitry may be analog or digital. In one preferred embodiment, the signal processing module 132 comprises a low pass filter. An output 196 of the signal processing module 132 is coupled to the feedback control module 136. The feedback control module 136 is, in turn, coupled to the laser 104. In apreferred embodiment, the feedback control module 136 comprises circuitry adapted to control the temperature of the laser 104. In another preferred embodiment, the feedback control module 136 comprises circuitry adapted to control the bias level of the laser 104.

In operation and use, the laser 104 lases at the single, desired frequency as determined, in part, by laser structure, composition and/or operating conditions, for example. In a preferred embodiment, the laser 104 emits light in the frequency range as is commonly used in optical communication systems. However, the present invention contemplates use and operation in frequency ranges that include, overlap with or do not overlap with the frequency range at which optical communication systems operate. Light is emitted from the output 152 of the laser 104 and is guided by the optical fiber 140 to the input 156 of the optical tap 108. The optical tap 108 divides the light between its two outputs 160 and 162 whereupon the two optical fibers 148 and 144, respectively, guide the light. Light guided by optical fiber 148 exits the system 100. Light guided by optical fiber 144 enters the input 164 of the FP 112. The FP 112 filters the light according to its frequency response as determined, in part, by the geometries of its optical cavity. The amount of amplification or attenuation of the light by the FP 112 is dependent, in part, on the frequency of the light and the frequency response of the FP 112 at that frequency. An optical signal 170 exits from the output 168 of the FP 112 and is received by the photodetector 116 which creates a photocurrent in response to the optical signal 170.

The modulator 124 creates a modulation signal which the modulator 124 uses to modulate the light emitted by the laser 104. The modulator signal is also provided at the input 176 of the derivative module 128 which provides at the output 180 a derivative signal which comprises the time derivative of the modulation signal. The derivative signal provided by the output 180 of the module 128 and the photocurrent provided by the photodetector 116 are provided at the inputs 184 and 172, respectively, to the balanced mixer 120. The balanced mixer 120 mixes the derivative signal and the photocurrent into a mixed signal. In a preferred embodiment, balanced mixer 120 multiplies the derivative signal by the photocurrent. The mixed signal provided by the output 188 of the balanced mixer 120 is processed by the signal processing module 132. The processing by the signal processing module 132 may be analog or digital signal processing. In a preferred embodiment, the processed signal, provided by the output 196 of the module 132, is an error signal.

The error signal comprises a feedback signal which controls the feedback control module 136 which, in turn, manipulates the laser 104. In a preferred embodiment under one sign convention, if the frequency of the laser 104 is equal to the desired laser frequency, then the error signal will have a value of about zero and the feedback control module 136 will not manipulate the laser frequency. If the frequency of the laser 104 has drifted to a frequency less than the desired laser frequency, then the error signal will have a positive value and the feedback control module 136 will manipulate the laser 104 such that the laser frequency will increase. If the frequency of the laser 104 has drifted to a value greater than the desired laser frequency, then the error signal will have a negative value and the feedback control module 136 will manipulate the laser 104 such that the laser frequency will decrease. In either event, the feedback control module 136 manipulates the laser 104 such that the laser frequency moves towards the desired frequency. In a preferred embodiment, both the magnitude and the sign of the error signal are factors that the feedback control module 136 uses to manipulate the laser 104.

There are a number of methods and systems for manipulating the laser 104 to control the frequency of the laser 104. In apreferred embodiment, the feedback control module 136 uses a temperature parameter to manipulate the frequency of the laser 104. In such an embodiment, the feedback control module 136 increases the temperature of the laser 104 in order to decrease the laser frequency. Conversely, the feedback control module 136 decreases the temperature of the laser 104 in order to increase the laser frequency. In a preferred embodiment, the temperature adjustment is determined not only by the sign of the error signal, but also by the magnitude of the error signal.

In another preferred embodiment, the feedback control module 136 uses a device bias parameter to manipulate the frequency of the laser 104. Device bias control takes the form of, for example, applied current or voltage levels. In one preferred embodiment, the feedback control module 136 increases the level of bias current of the laser 104 in order to increase the laser frequency. Conversely, the feedback control module 136 lowers the level of bias current of the laser 104 in order to decrease the laser frequency. In a preferred embodiment, the bias current level adjustment is determined not only by the sign of the error signal, but also by the magnitude of the error signal.

The following is a further discussion of the error signal and the signals used in computing the error signal. The error signal, as previously discussed, is computed, in part, from the balanced mixing of the time derivative of the modulation signal and the photocurrent. Referring to FIGS. 2–5, the time relationships between several different types of signals are illustrated.

Figure 2:
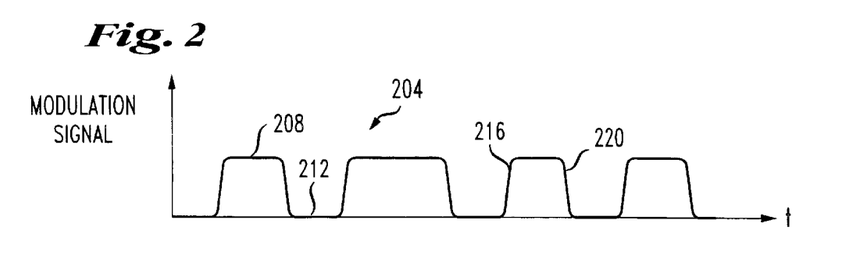
FIG. 2 illustrates an example of a modulation signal according to the present invention.

In a preferred embodiment, the modulation signal is in digital form. FIG. 2 is an example of the modulation signal 204 for the digital signal "10110101". In the illustrated example, the modulation signal 204 comprises phases 208 and 212, wherein the value of the modulation signal 204 is relatively stable, and phases 216 and 220, wherein the value of the modulation signal 204 is changing relatively rapidly. During the relatively constant phases 208 and 212, the modulation signal 204 has a digital value of "1" and "0", respectively. During the transition phase 216, the modulation signal 204 is transitioning in digital value from a "0" to a "1". The transition phase 216 is, in a preferred embodiment, characterized by an upward, positive slope. During the transition phase 220, the modulation signal 204 is transitioning in digital value from a "1" to a "0". The transition phase 220 is, in a preferred embodiment, characterized by a downward, negative slope.

Figure 3:
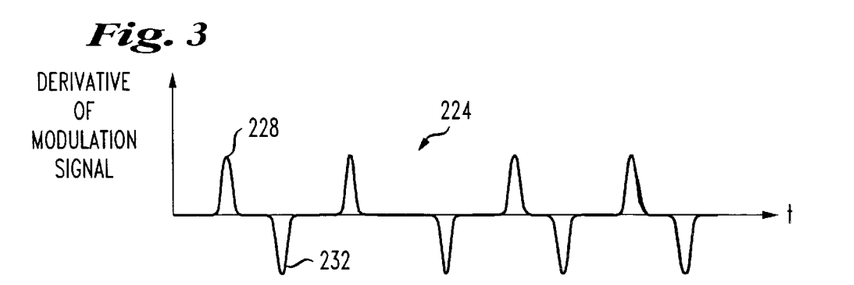
FIG. 3 illustrates an example of a time derivative of the modulation signal according to the present invention.

FIG. 3 illustrates the time derivative of the modulation signal 204 illustrated in FIG. 2. The derivative signal 224 has the value of approximately zero during the relatively phases 208 and 212 of the modulation signal 204. During the transition phase 216 of the modulation signal 204, the derivative signal 224 is a positive, narrow pulse 228. During the transition phrase 220 of the modulation signal 204, the derivative signal 224 is a negative, narrow pulse 232. In a preferred embodiment, the peak values of the pulses 228 and 232 are normalized.

Figure 4:
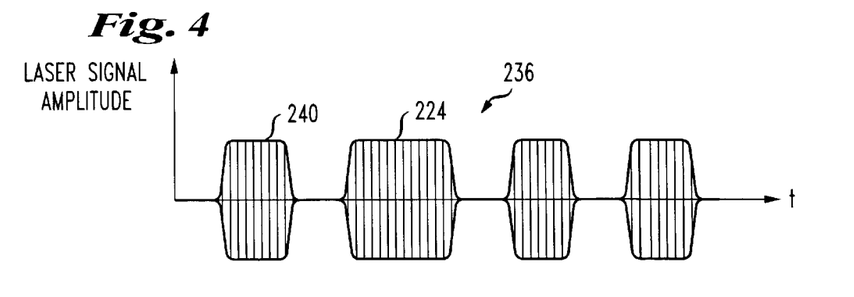
FIG. 4 illustrates an optical signal from the laser according to the present invention.

FIG. 4 is an illustration of an optical signal 236 emitted from the output 152 of the laser 104. Since the laser 104 is modulated by the modulation signal 204, as described previously, the optical signal 236 comprises a light signal 240 at the frequency of the laser 104 and an envelope signal 244 at the frequency of the modulation signal 204. In a preferred embodiment, the envelope signal 244 varies at frequencies lower than the light signal 240. The envelope signal 244 results from the application of the modulation signal 204 to the laser 104, and thus has a corresponding likeness to the modulation signal 204 of FIG. 2.

The dynamic shift of the lasing frequency of the laser 104 during a modulation cycle is referred to as frequency chirping. One characteristic of frequency chirping is that, within a modulation cycle, when the envelope signal 244 transitions from a "0" to a "1", the laser frequency briefly increases. Furthermore, when the envelope signal 244 transitions from a "1" to a "0", the laser frequency briefly decreases.

Figure 5:
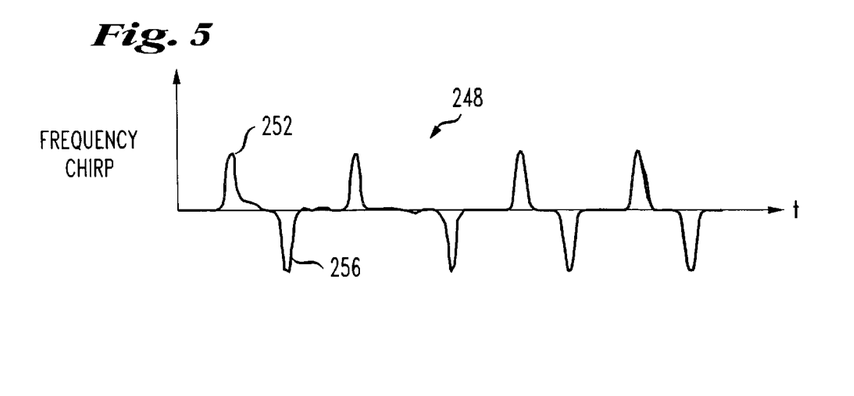
FIG. 5 illustrates a frequency chirp signal according to the present invention.

FIG. 5 is an illustration of a frequency chirp signal 248. In relation to the optical signal 236 of FIG. 4 and the modulation signal 204 of FIG. 2, the frequency chirp signal 248 only becomes relatively substantial during the transition phases 216 and 220. During the transition phase 216 when both the modulation signal 204 and the envelope signal 244 have upward, positive slopes, the frequency chirp signal 248 is a positive, narrow pulse 252. During the transition phase 220 when both the modulation signal 204 and the envelope signal 244 have downward, negative slopes, the frequency chirp signal 248 is a negative, narrow pulse 256. In a preferred embodiment, the frequency chirp signal 248 of FIG. 5 resembles the derivative signal 224 of FIG. 3.

Figure 6:
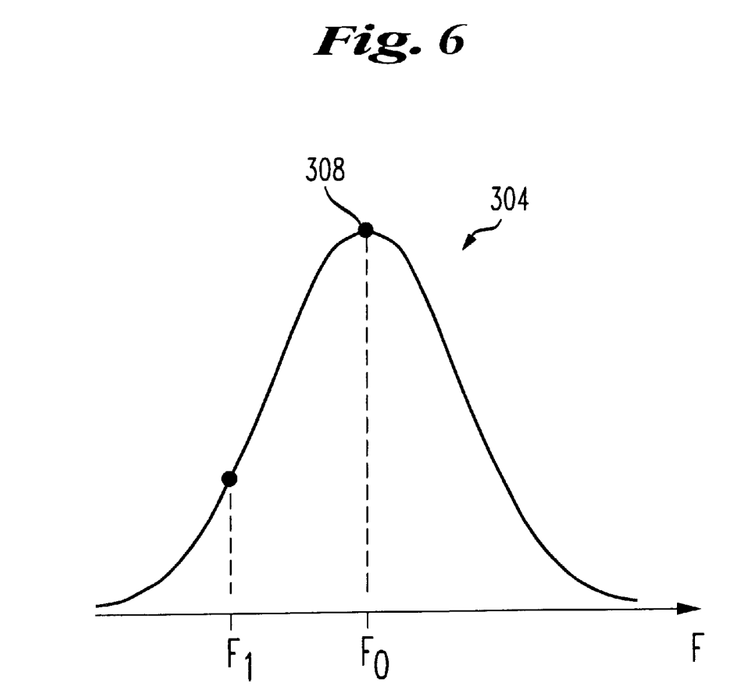
FIG. 6 illustrates examples in which frequency chirping is not substantially considered.

FIG. 6 illustrates an example in which the frequency chirp signal 248 is ignored in the analysis. The FP 112 has a frequency response 304 which has a number of resonant peaks 308 of which only one is shown at frequency $F_0$. In a preferred embodiment, the laser 104 is designed such that it lases at one frequency coinciding with one of the peaks 308 of the frequency response 304 of the FP 112. In another preferred embodiment, the FP 112 is designed such that one of the resonant peaks 308 of the frequency response 304 coincides with the desired laser frequency. In one example in which the laser 104 lases at frequency $F_0$, a photocurrent 312 provided by the photodetector 116 representing the digital signal "1011" is illustrated. In another example, in which the laser 104 lases at frequency $F_1$, a photocurrent 316 provided by the photodetector 116 is illustrated with a smaller amplitude. The decrease in amplitude in photocurrent 316 is related to the decrease in amplitude in the frequency response 304 at frequency $F_1$ compared to at frequency $F_0$. In either case, the time derivative of the modulation signal would be the same, since the derivative signal 320 from the derivative module 128 is independent of the frequency of the laser 104. Although the balanced mixing of photocurrents 312 and 316 with the derivative signal 320 produces different mixed signals, the time average of those different mixed signals over many modulation cycles is about zero in both cases. Thus, in both cases where the laser frequency is stable, the error signal 324 is about zero when the frequency chirp is not substantially factored into the analysis. Furthermore, the examples illustrate that, without substantially factoring in the effects of frequency chirping, a mere amplitude change of the entire optical signal or the entire corresponding photocurrent caused by a stable change in lasing frequency has no substantial effect on the error signal.

Figure 7:
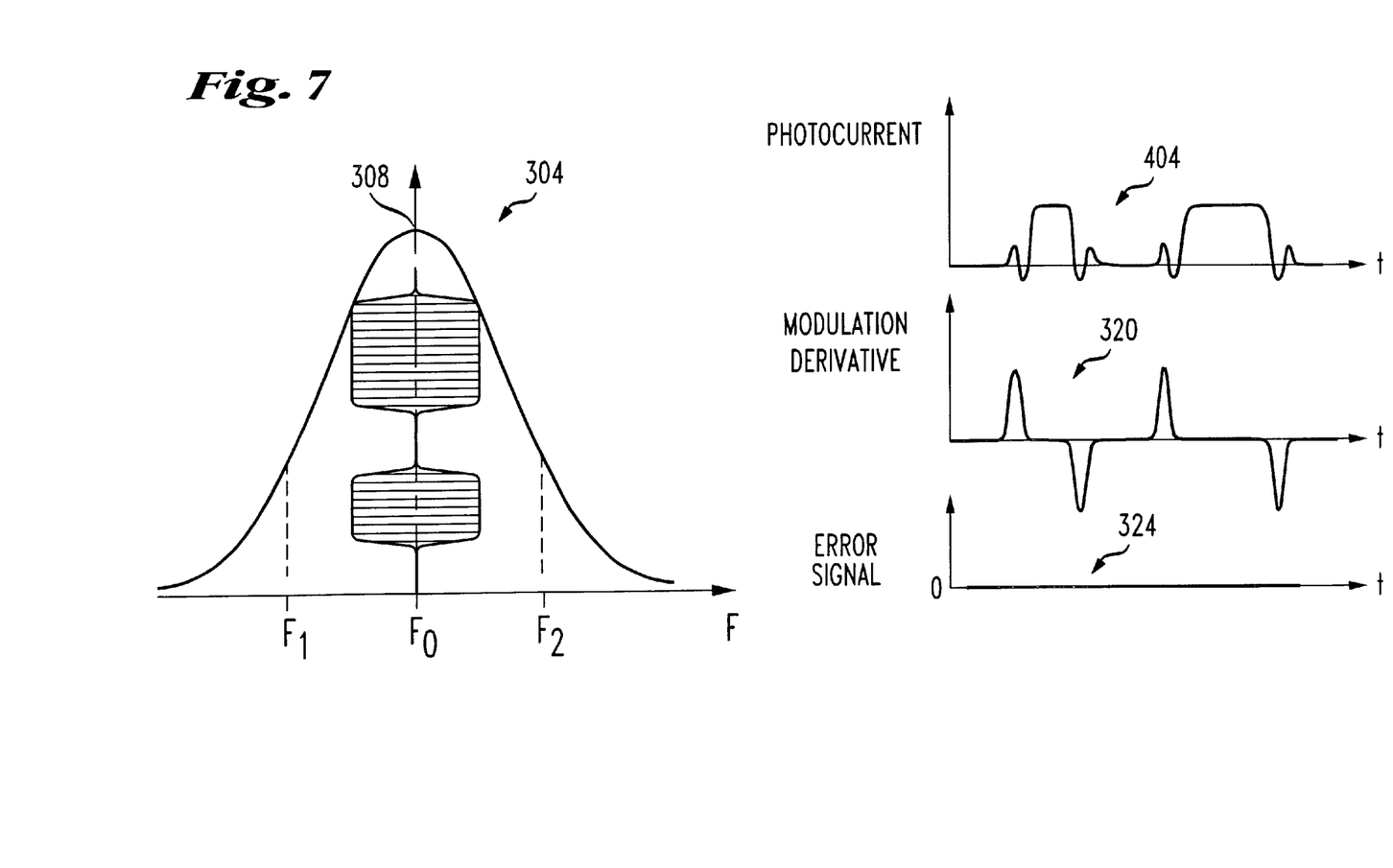
FIG. 7 illustrates an example according to the present invention in which frequency chirping is substantially considered and the frequency of the laser is centered on a peak resonant frequency of a frequency response of a Fabry-Perot etalon.
Figure 8:
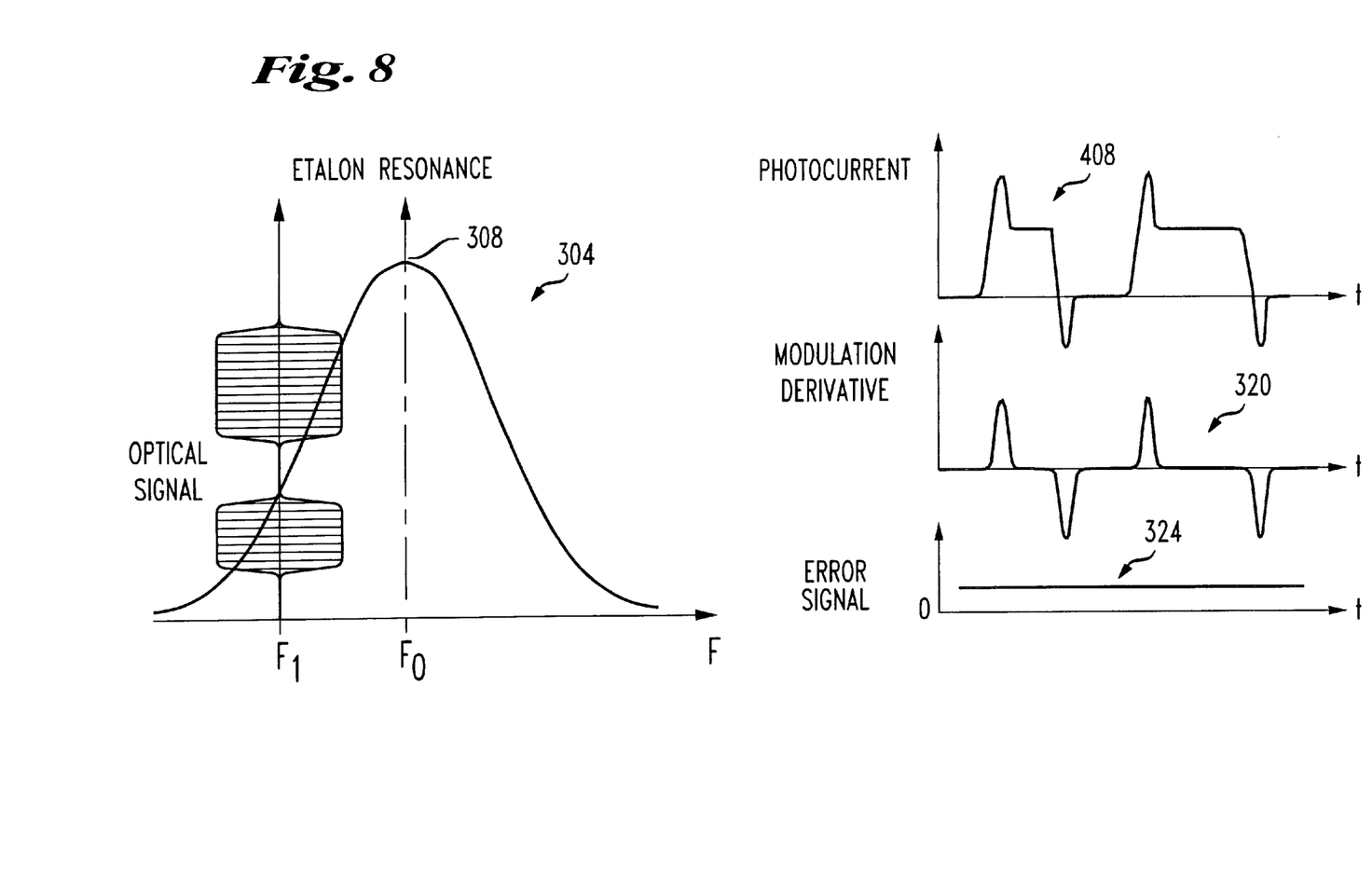
FIG. 8 illustrates an example according to the present invention in which frequency chirping is substantially considered and the frequency of the laser is less than the frequency of the peak resonant frequency of the frequency of the Fabry-Perot etalon.
Figure 9:
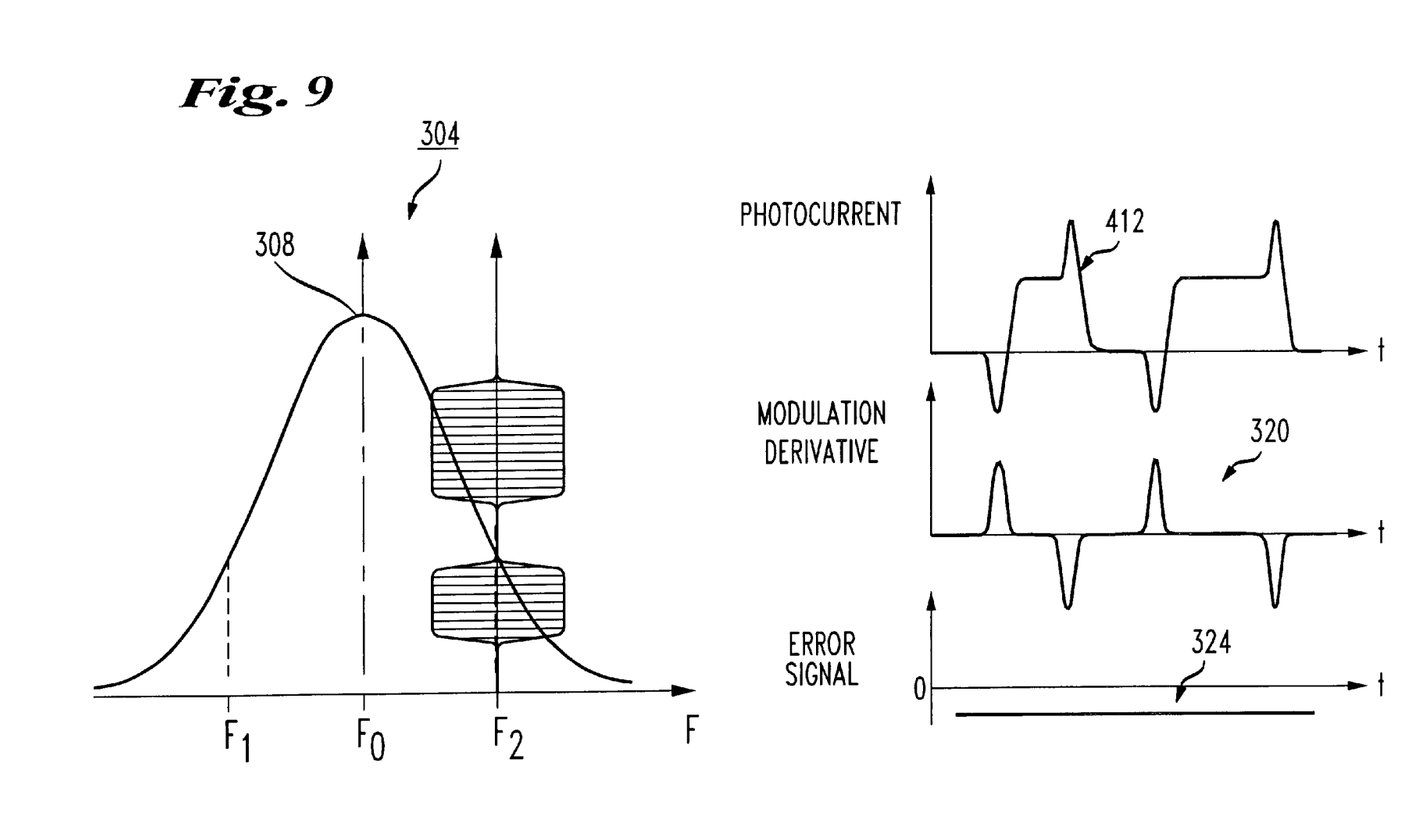
FIG. 9 illustrates an example according to the present invention in which frequency chirping is substantially considered and the frequency of the laser is more than the frequency of the peak resonant frequency of the frequency response of the Fabry-Perot etalon.

FIGS. 7–9 illustrate examples according to the present invention in which the frequency chirp is substantially factored into the error signal 324 at different lasing frequencies. FIG. 7 is an example in which the frequency of the laser 104 coincides with the peak 308 at frequency $F_0$ of the frequency response 304 of the FP 112. FIG. 8 is an example in which the laser frequency $F_1$ is less than the frequency $F_0$ of the frequency response 304 of the FP 112. FIG. 9 is an example in which the laser frequency $F_2$ is greater than the frequency $F_0$ of the frequency response 304 of the FP 112.

In FIG. 7, the laser frequency coincides with the frequency $F_0$ of the peak 308. However, because of frequency chirping, the laser frequency varies around $F_0$ within each modulation cycle. Referring also to FIG. 5, qualitatively, when the frequency chirp signal 248 is the positive, narrow pulse 252, the laser frequency increases above the peak frequency $F_0$ which, according to the frequency response 304 of the FP 112, results in a decrease in gain at the output 168 of the FP 112. When the frequency chirp signal 248 is the negative, narrow pulse 256, the laser frequency decreases below the peak frequency $F_0$ which, according to the frequency response 304 of the FP 112, results in an approximately similar decrease in gain at the output 168 of the FP 112. The optical signal 170 emitted by the output 168 of the FP 112 is received by the photodetector 116 which then creates a corresponding photocurrent 404 as shown in FIG. 7. The derivative signal 320 is independent of the laser frequency. The balanced mixing of the photocurrent 404 and the derivative signal 320 by the balanced mixer 120 and the subsequent time averaging of that mixed signal by the signal processing module 132 create the error signal 324 with value of about zero.

In FIG. 8, the laser frequency has drifted to frequency $F_1$ which is less than the frequency $F_0$ of the peak 308. Because of frequency chirping, during the modulation cycle, the laser frequency varies around the frequency $F_1$ at a part of the frequency response 304 which has a positive, upward slope around frequency $F_1$. Qualitatively, when the frequency chirp signal 248 is the positive, narrow pulse 252, then the laser frequency is greater than $F_1$ and the frequency chirp signal 248 sees a larger gain than at frequency $F_1$. When the frequency chirp signal 248 is the negative, narrow pulse 256, then the laser frequency is smaller than $F_1$ and the frequency signal 248 sees a smaller gain than at frequency $F_1$. Qualitatively, because of this imbalance in gain at different times in the modulation cycle of the laser 104, a photocurrent 408 is created by the photodetector 116 which is more positively biased. As a result, the balanced mixing and subsequent time averaging of the mixed signal results in the error signal 324 which has a positive value.

In FIG. 9, the laser frequency has drifted to frequency $F_2$ which is greater than the frequency $F_0$ at the peak 328. Because of frequency chirping, during the modulation cycle, the laser frequency varies around the frequency $F_2$ at a part of the frequency response 304 which has a negative, downward slope around frequency $F_2$. Qualitatively, when the frequency chirp signal 248 is the positive, narrow pulse 252, then the laser frequency is greater than $F_2$ and the frequency chirp signal 248 sees a smaller gain than at frequency $F_2$. When the frequency chirp signal 248 is the negative, narrow pulse 256, then the laser frequency is smaller than $F_2$ and the frequency chirp signal 248 sees a larger gain than at frequency $F_2$. Qualitatively, because of this imbalance in gain at different times in the modulation cycle of the laser 104, a photocurrent 412 is created by the photodetector 116 which is more negatively biased. As a result, the balanced mixing and subsequent time averaging of the mixed signal results in the error signal 324 which has a negative value.

In the foregoing description, the method and apparatus of the present invention have been described with reference to specific preferred embodiments. It is to be understood and expected that variations in the principles of the method and apparatus herein disclosed may be made by one skilled in the art and it is intended that such modifications, changes, and substitutions are to be included within the scope of the present invention as set forth in the appended claims. The specification and the drawings are accordingly to be regarded in an illustrative rather than in a restrictive sense.

What is claimed is:

1. An apparatus for laser frequency stabilization, comprising:

a laser with an output, the laser having a desired frequency and providing an optical signal at the output of the laser, the optical signal including a substantial frequency chirp signal;

a modulator coupled to the laser, and that provides a modulation signal for modulating the laser;

a derivative module coupled to the modulator, and that provides a derivative signal which is a time derivative of the modulation signal;

a Fabry-Perot etalon coupled to the output of the laser, the etalon having a frequency response including a plurality of resonances, one of the plurality of resonances being centered on the desired frequency;

a photodetector coupled to the etalon and that provides a photocurrent in response to a filtered optical signal;

a balanced mixer coupled to the photodetector and to the derivative module, and that provides a mixed signal from the photocurrent and the derivative signal;

a signal processing module coupled to the balanced mixer, and that provides an error signal which is a time average of the mixed signal; and a feedback control module coupled to the signal processing module and the laser, and that receives the error signal.

2. A laser frequency stabilization system, comprising:

a laser lasing at substantially a single frequency, the laser having a desired frequency and providing an optical signal, the optical signal including a substantial frequency chirp signal;

an optical filter coupled to the laser, the optical filter having a frequency response with a resonant peak centered on the desired frequency of the laser;

a photodetector coupled to the optical filter, and that receives an output of the optical filter and provides a photocurrent in response thereto;

a modulator coupled to the laser, and that provides a modulation signal which modulates the optical signal of the laser;

a derivative module coupled to the modulator, and that provides a derivative signal which is a time derivative of the modulation signal; and a balanced mixer coupled to an output of the derivative module and to an output of the photodetector, and that provides a mixed signal from the photocurrent and the derivative signal.

3. The laser frequency stabilization system according to claim 2, wherein the laser operates within a frequency range utilized in optical communications.

4. The laser frequency stabilization system according to claim 2, wherein the single frequency has drifted from the desired frequency.

5. The laser frequency stabilization system according to claim 2, wherein the frequency chirp signal causes the laser to vary around the single frequency during a modulation cycle of the modulation signal.

6. The laser frequency stabilization system according to claim 2, wherein the optical filter is a Fabry-Perot etalon.

7. The laser frequency stabilization system according to claim 2, wherein the photodetector comprises a photodiode and a resistor.

8. The laser frequency stabilization system according to claim 2, wherein the derivative module comprises a capacitor and a resistor.

9. The laser frequency stabilization system according to claim 2, wherein the balanced mixer multiplies the derivative signal by the photocurrent.

10. The laser frequency stabilization system according to claim 2, further comprising a signal processing module coupled to the balanced mixer, the signal processing module providing an error signal including a time average of the mixed signal.

11. The laser frequency stabilization system according to claim 10, wherein the signal processing module comprises a low pass filter.

12. The laser frequency stabilization system according to claim 10, wherein the signal processing module is a digital signal processor.

13. The laser frequency stabilization system according to claim 10, further comprising a feedback control module coupled to the signal processing module and the laser, the feedback control module utilizing the error signal to adjust the single frequency at which the laser lases.

14. The laser frequency stabilization system according to claim 13, wherein the feedback control module adjusts the single frequency at which the laser lases by controlling laser temperature.

15. The laser frequency stabilization system according to claim 13, wherein the feedback control module adjusts the single frequency at which the laser lases by controlling a bias parameter of the laser.

16. A method for stabilizing laser frequency comprising controlling the frequency response of a laser based on an error signal that is generated by mixing (i) a signal based on a time derivative of a modulation signal, and (ii) a photocurrent signal, wherein the photocurrent signal is generated based on an output of the laser.

* * * * *